United States Patent [19]

Spies et al.

[11] Patent Number: 5,005,085
[45] Date of Patent: Apr. 2, 1991

[54] CONTROLLABLE SEMICONDUCTOR IMAGE SENSOR AND ARRANGEMENT WITH SUCH A SENSOR

[75] Inventors: Hans Spies, Pfaffenhofen; Alfons Woehrl, Schrobenhausen; Martin Spies, Pfaffenhofen, all of Fed. Rep. of Germany

[73] Assignee: Messerschmitt-Boelkow-Blohm GmbH, Munich, Fed. Rep. of Germany

[21] Appl. No.: 440,601

[22] Filed: Nov. 22, 1989

[30] Foreign Application Priority Data

Nov. 23, 1988 [DE] Fed. Rep. of Germany ....... 3839512

[51] Int. Cl.$^5$ .................... H04N 5/335; H04N 3/14; H04N 5/30
[52] U.S. Cl. .................... 358/213.11; 358/125; 358/173; 358/209
[58] Field of Search ............... 358/125, 347, 173, 184, 358/209, 213.11, 213.13, 213.31, 213.19, 210

[56] References Cited

U.S. PATENT DOCUMENTS 4,721,999  1/1988  Takemura et al. ................. 358/209

FOREIGN PATENT DOCUMENTS 0309927  4/1989  European Pat. Off. .
3817153  5/1988  Fed. Rep. of Germany .
36403449  6/1988  Fed. Rep. of Germany .

OTHER PUBLICATIONS

"Variable Electronic Shutters Mounted in Interline System for First Time", Prepared in Nov., 1988, 80928-TO.
Elektronikpraxis, Nr. 9, Sep. 1978, pp. 12-15, "Zeilen-und flaechenhafte Halbleiter-Bildsensoren", H. Herbst.
Bild der Wissenschaft (10) 1988, pp. 134-135, "Prometheus-Steuermann durch den Verkehr von morgen".
Funkschau (14) 1988, pp. 42-44, "Autos am laufenden Band".

Primary Examiner—Howard W. Britton
Assistant Examiner—Tuan V. Ho
Attorney, Agent, or Firm—W. G. Fasse; D. H. Kane, Jr.

[57] ABSTRACT

A semiconductor optical image sensor is constructed particularly as a CCD-structure having a linear or two-dimensional array configuration with parallel or serial read-out. The CCD-structure is combined with an avalanche diode structure arranged on one side of the semiconductor or in laterally spaced locations to allow an optically controllable amplification of the image signal in the image sensor by an avalanche effect.

10 Claims, 5 Drawing Sheets

CONTROLLABLE SEMICONDUCTOR IMAGE SENSOR AND ARRANGEMENT WITH SUCH A SENSOR

CROSS-REFERENCE TO RELATED APPLICATION

The present application relates to U.S. patent application Ser. No.: 07/440,603, filed in the U.S. Patent and Trademark Office on: Nov. 2, 1989, and entitled: IMAGE SENSOR.

FIELD OF THE INVENTION

The invention relates to a semiconductor image sensor of which the output signal may be controllably amplified. The invention also relates to a sensor arrangement using such a semiconductor sensor.

BACKGROUND INFORMATION

Image sensors made of semiconductor elements are known in the art. An article providing an over-view of such image sensors by H. Herbst appears in "Elektronik-Praxis", No. 9 September 1978, pages 12 to 14. The construction and use of such semiconductor image sensors involves circuitry requiring an utmost integration capability. Hence, great demands are made on the production technology. This is especially true if the output signals which are outputted by the sensor, for example, after incidence of radiation on the sensor, are only very small.

It is also known to provide a read-out electrode structure on the surface of the image sensor such as a CCD-array. The read-out electrode structure in the form of parallel strips is applied to the sensor. Electrode configurations are disclosed in German Patent Publication (DE) 3,817,153 A1, corresponding to U.S. Ser. No.: 07/354,469, filed May 19, 1989 which is not a prior publication with regard to the present priority date of Nov. 23, 1988.

European Patent Publication 0,309,927 (Laucht et al.), published on Apr. 6, 1989, discloses an image distance sensor that could be used in conjunction with the present invention. The disclosure of said European patent publication is incorporated herein by reference.

It is known to use image sensors in various image detection systems, for example, in distance measuring and proximity warning systems are disclosed, for example, in German Patent Publication (DE) 3,640,449C1, published June 30, 1988. Such sensors are also used in an automatic control and guidance system for motor vehicles travelling on a highway while maintaining a prescribed relative spacing between the vehicles travelling in a column as described in "Funkschau" Nr. 14/1988, page 42 pp. Use in a similar automatic vehicle guidance system known as "Prometheus" described in "Bild der Wissenschaft", Nr. 10/1988, pages 134, 135 is also possible.

OBJECTS OF THE INVENTION

In view of the foregoing it is the aim of the invention to achieve the following object singly or in combination:

to construct a semiconductor image sensor having an improved signal to noise ratio to provide an increased output signal compared to prior art image sensors;

to control the signal amplification in such an image sensor by simple means and in a simple manner; and to construct such an image sensor in an economical manner employing generally known methods of semiconductor doping, masking, etching, and related techniques.

SUMMARY OF THE INVENTION

The above objects have been achieved according to the invention by a semiconductor image sensor, particularly having a CCD-structure, arranged as a one-dimensional linear array or as a two-dimensional surface array with a parallel or serial read-out, and with an avalanche diode arranged on one side for amplifying a photo-current produced by a light input, wherein a space charge is produced in the neighboring or connecting semiconductor zone, wherein charge carriers are transported to a CCD-read-out structure for outputting a contrast or distance image by said CCD-read-out structure arranged on the other side of the semiconductor, and wherein optical control is provided by introducing pulsed light, especially pulsed laser light into said semiconductor zone in which said space charge has been produced.

Thus, the present image sensor is essentially a photosensitive semiconductor element such as a CCD-element in which the signal may be amplified by employing an avalanche effect in a surfacial avalanche diode element of the semiconductor. The avalanche effect and therewith the amplification, can be optically controlled simply by appropriately illuminating the image sensor with a control laser beam which may be pulsed in a controlled manner. By using the avalanche effect of a surfacial avalanche diode on a CCD-sensor, the sensitivity and amplification of the sensor element is increased by a factor of approximately one hundred.

The controllably amplifying image sensor according to the invention may be advantageously used as a shutter or sampler for video images, or as a receiver in a motor vehicle distance measuring system and proximity warning system, or as a receiver in an automatic motor vehicle guidance system employing a guide track as part of an integrated services data network in which vehicles keep a defined mutual distance.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1A:
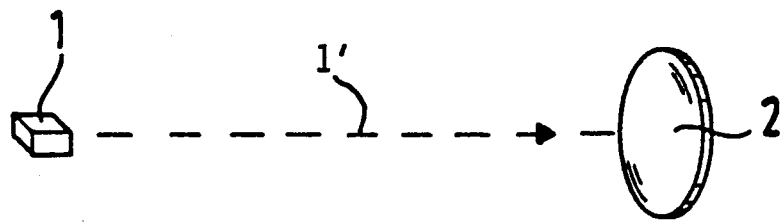
FIGS. 1A, 1B and 1C illustrate a schematic perspective view of the essential elements of an optical sensor arrangement using the present sensor, for example in a motor vehicle for providing information regarding obstacles on the road ahead.
Figure 1B:
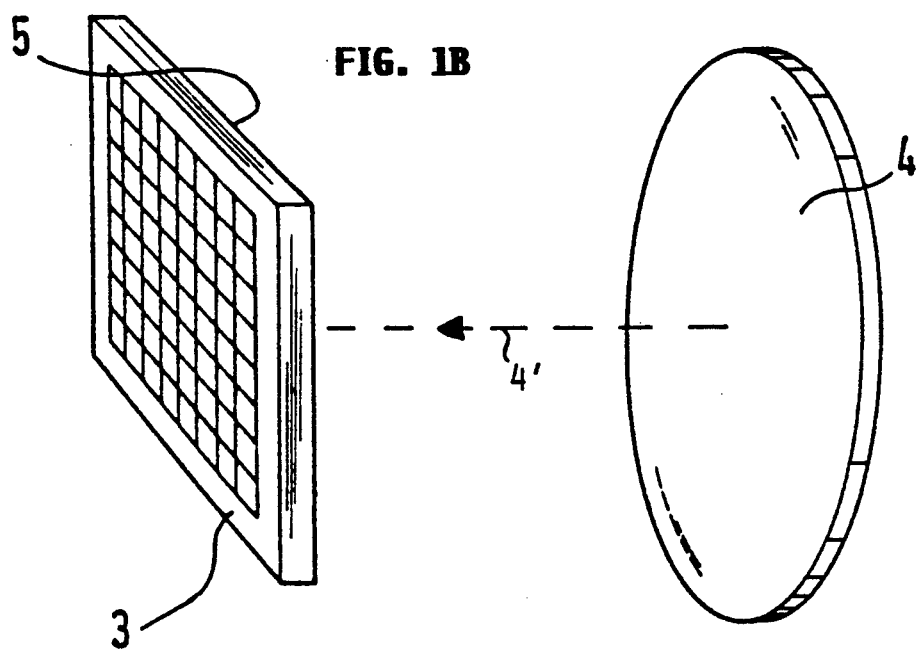
Figure 1C:
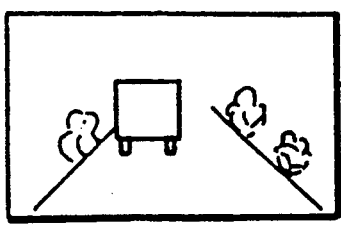

FIGS. 1A, 1B, and 1C schematically show an optical sensor arrangement for sensing images incorporating an image sensor according to the invention used, for example, in a motor vehicle guidance and control system. In the arrangement FIG. 1A shows a laser source 1 carried by each vehicle participating in the system for transmitting an illuminating laser bean 1' through transmitting optics 2 in the travel direction to illuminate an image of the road scene ahead. The road scene is now shown, but lies to the right of FIGS. 1A, 1B and 1C. Reflected light 4' returns from the image scene through receiving optics 4 and impinges on an image receiver or optical sensor embodied as a flat planar semiconductor CCD-array 3 as shown in FIG. 1B. A received image display 6 is shown schematically in FIG. 1C to illustrate the output from the optical sensor CCD-array 3 viewing forward from a motor vehicle.

The vehicle guidance and control system which as such is not part of the invention, may simultaneously project, receive, and evaluate laser beams for distance measurements to obstructions or other travelling vehicles in front of the motor vehicle carrying the present arrangement. Means for evaluating the image signals received from the present CCD-sensor 3 including evaluation circuitry are known as such and are therefore not shown and described in detail herein, merely the display 6 is shown on a reduced scale.

As further indicated in FIGS. 1A, 1B and 1C the image receiver according to the invention includes an avalanche diode 5 on one surface of the CCD-sensor 3. The avalanche diode 5 is attached to the semiconductor and receives the incident laser radiation represented by the reflected light beam 4'. This feature is achieved by implanting or doping an appropriate layer on the back-side of a CCD-chip. The various materials and manufacturing techniques for achieving the implanting or doping are known.

Figure 2A:
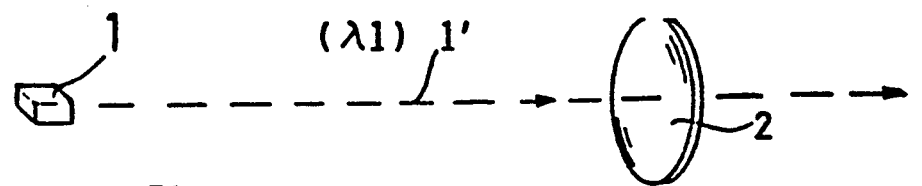
FIGS. 2A and 2B show a schematic perspective view similar to the embodiment of the invention as shown in FIGS. 1A, 1B, and 1C, wherein the optical sensor functions as a shutter controlled by a pulsed laser beam.
Figure 2B:
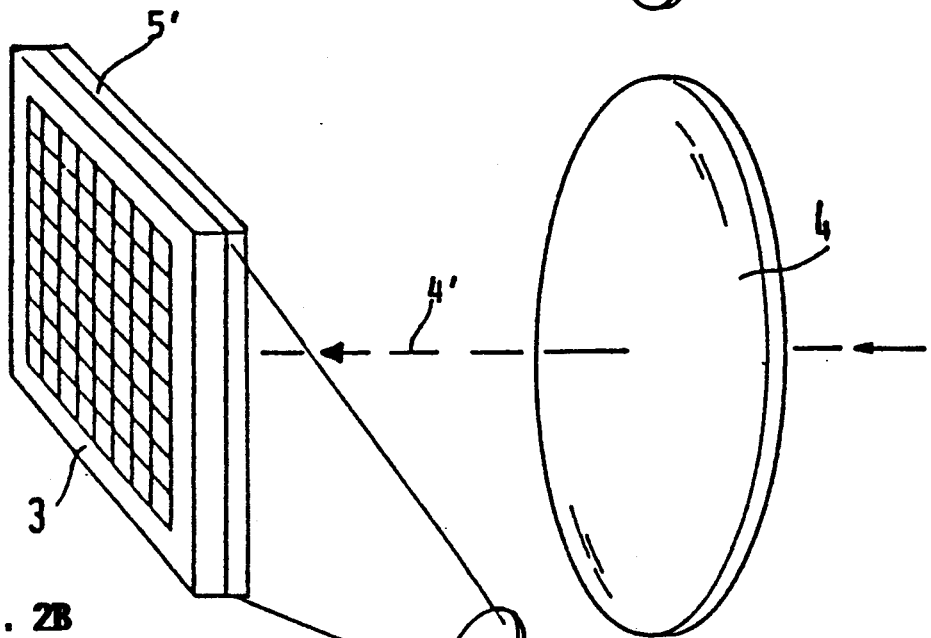

FIGS. 2A and 2B show an arrangement according to the invention, similar to that of FIGS. 1A, 1B and 1C, but further including a controllable shutter 5' and means for controlling or gating the shutter 5'. These gating means include a semiconductor laser 7 operating as a gating or control laser 7 which projects a gating or control beam 7' through control optics 8 to impinge upon the CCD-sensor 3. The laser 7 providing the control beam 7 operates at a gating wave length $\lambda 2$, preferably between 1400 nm and 1800 nm. In choosing the gating wave length $\lambda 2$ it is important that $\lambda 2$ is sufficiently differential from the wave length $\lambda 1$ of the reflected light beam 4 to be measured and projected by the illuminating laser 1, for example, at a wave length $\lambda 1$ of between 800 and 950 nm which is typical for semiconductor lasers used for distance measurement.

The incidence of the beans 4', 7' is shown in more detail in FIGS. 3, 4, 5, and 7 as described below. The controllable optic shutter 5' is operated in a gating mode instead of the typical CCD-semiconductor element arrangement shown in FIGS. 1A, 1B, 1C FIG. 9, to be described in more detail below, illustrates the gating control of the semiconductor laser 7 emitting gating light pulses having a wave length $\lambda 2$.

Figure 3:
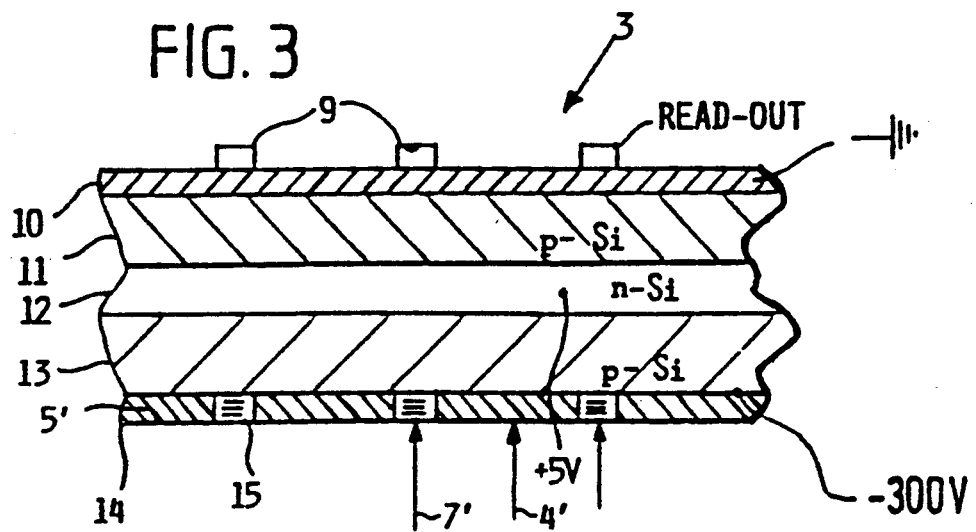
FIG. 3 is a cross-sectional view through the CCD-optical sensor for operating as a receiver element in the arrangement of FIGS. 2A and 2B.

FIG. 3 is a cross-sectional view showing the geometric arrangement of the receiver or optical CCD-sensor 3 of FIG. 2, especially including the optical shutter 5' for an exposure control. The general semiconductor layer structure is p-n-p. The semiconductor sandwich includes a bottom layer 13 of p-Si, a middle layer 12 of n-Si, and a top layer 11 of p-Si. Read-out electrodes 9 are attached to the top or back electrode 10. As shown, both the image beam 4' and the control beam 7' are incident on the bottom or front electrode functioning as a shutter 5' which includes elements 14 and 15 which are respectively sensitive or transparent or excitable at the wave lengths $\lambda 1$ of the image beam 4' within the range of 800 to 950 nm, and $\lambda 2$ of the control or gating beam 7' at 1400 nm. A voltage of up to $-300$ V is applied between ground, electrode 10, and the layer 13. A voltage of approximately $+5$ V is applied between the middle n-Si layer 12 and ground 10. Application of the $-300$ Volts triggers the reverse avalanche breakdown, so that the incident radiation can pass through the semiconductor structure thereby generating image signals which may be read out at the electrodes 9 in a manner described, for example, in the German Patent Publication (DE) 3,817,153 A1 or in the manner shown in the block circuit diagram of FIG. 9.

Figure 4:
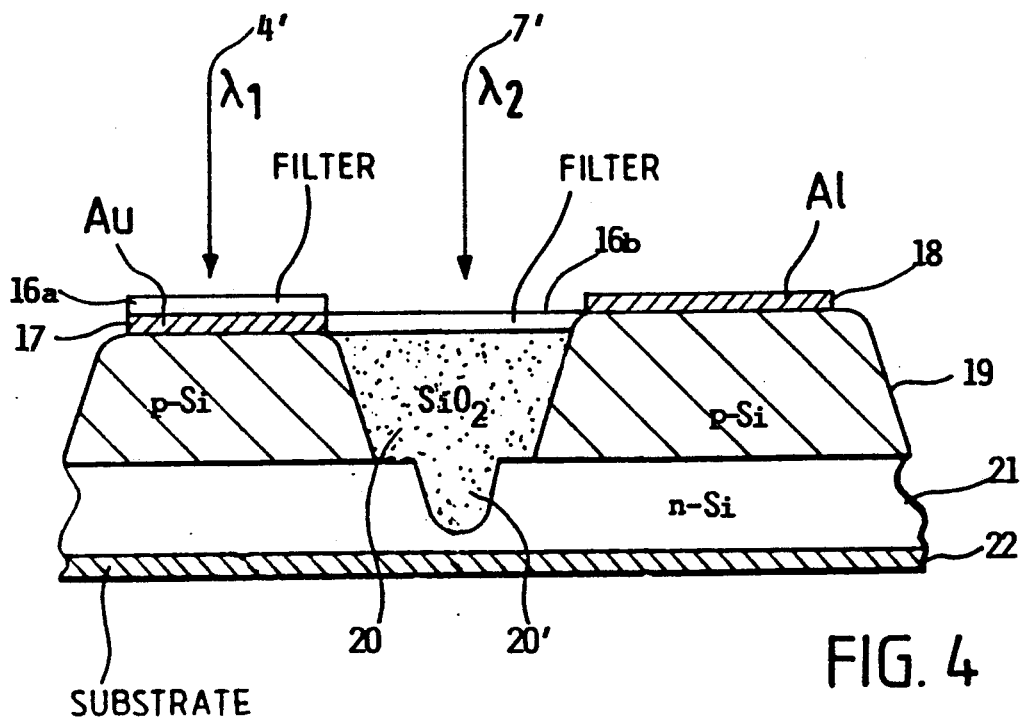
FIG. 4 shows a cross-section similar to that of FIG. 3, but through a modified embodiment of a CCD-optical sensor also for operating as a receiver element.

FIG. 4 shows an embodiment of an optical sensor in which the avalanche effect does not occur on the surface or back side of the CCD which receives the incident radiation, but rather the avalanche effect occurs laterally, or in other words, horizontally in side-by-side fashion as shown in FIG. 4.

A transparent or semitransparent substrate 22 carries a high ohmic or highly resistive n-Si layer 21 on which a CCD-structure is applied in a horizontally and sectionally seen middle area, including p-Si layer regions 19 and an $SiO_2$ region 20, the latter reaching into the n-Si layer 21 as shown at 20'. The regions 20 and 20' are also p-Si regions and are transparent $SiO_2$. Specifically, the cone-shaped region 20' between adjacent p-Si regions 19 partially penetrates into or is embedded in the n-Si layer 21. The CCD-structure on the right side of FIG. 4 comprising the p-Si layer 19 includes a read-out structure 18 especially an electrode structure 18 made of aluminum electrodes or the like. On the left side of FIG. 4, a thin conductor layer 17 of transparent material such as gold, is applied and preferably one or more filter layers 16a are applied over the conductor layer 17. The filter layer 16a selectively transmits the incident image beam 4' at the wave length $\lambda 1$. A further filter layer 16b may be applied over the transparent $SiO_2$ region 20 to selectively transmit the control or gating beam 7' at the wave length $\lambda 2$.

Figure 5:
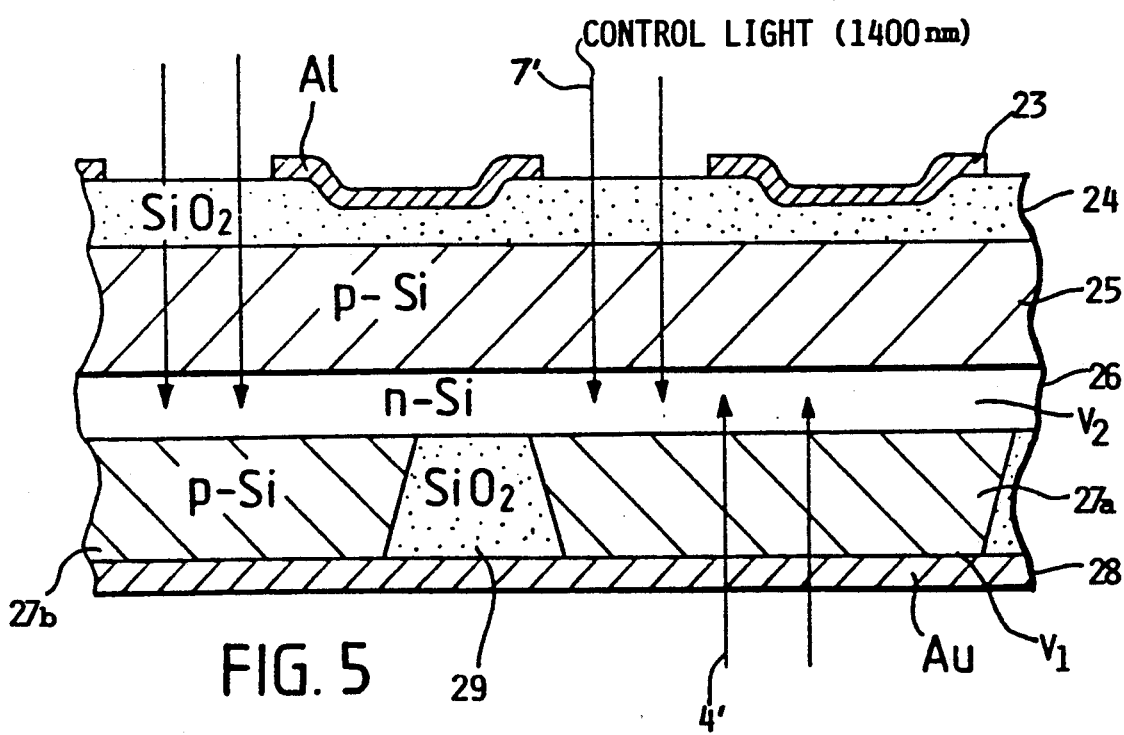
FIG. 5 is a cross-section through a further variation of a CCD-optical sensor element.

FIG. 5 shows a cross-section through a further embodiment of an optically controllable image sensor according to the invention, wherein the image beam 4' and the control beam 7' are incident on the semiconductor sensor element from opposite sides. A thin transparent layer 28 of, for example, gold, forms the cover electrode of the semiconductor package on the side of incidence of the image beam 4'. The gold layer or electrode 28 is applied to a layer made up of regions 27a, 27b of p-Si laterally separated from one another by regions 29 of $SiO_2$. Next in the sandwich arrangement is a layer 26 of high ohmic or highly resistive n-Si and next is a layer 25 of continuous p-Si. Next in the arrangement is a continuous top layer 24 of transparent or semi-transparent material, preferably of $SiO_2$ onto which read-out electrodes 23 of aluminum or gold or the like are deposited in the form of parallel strips by means of masking techniques, or especially photolithographic techniques. These electrodes 23 may have the shape as described in the above mentioned German Patent Publication (DE) 3,817,153 A1.

In FIG. 5 the control or gating light beam 7' enters the semiconductor element from above through the $SiO_2$ layer 24 to generate a space charge in the semiconductor element. It is advantageous if the various elements, especially the read-out electrode strips 23, are arranged so that the incident image beam 4' does not enter into the semiconductor immediately vertically below the control light beam 7', but rather displaced laterally or horizontally therefrom as shown in FIG. 5.

Figure 6:
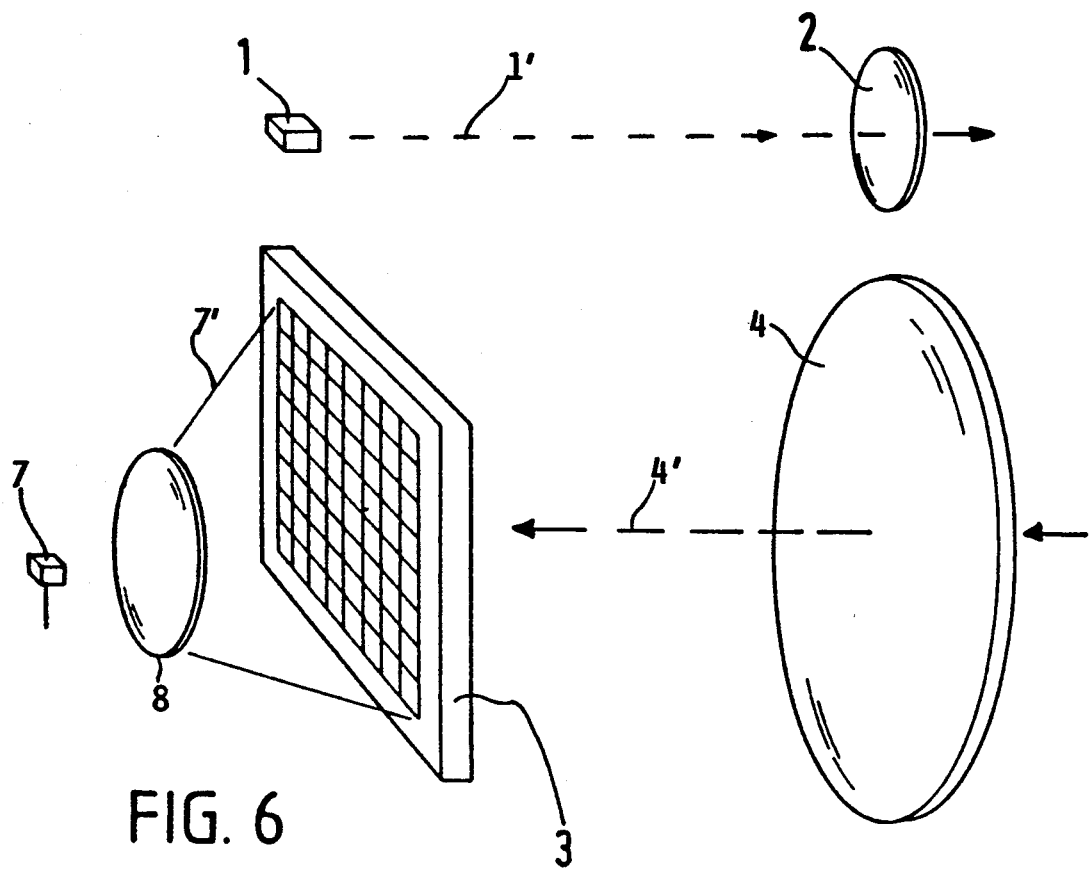
FIG. 6 is a schematic perspective view of a receiver arrangement incorporating the CCD-optical sensor element of FIG. 5.

FIG. 6 shows an arrangement which could for example, use the semiconductor image sensor element shown in detail in FIG. 5 or other sensor elements of the invention which receive the control light beam 7' and the image light beam 4' on opposite sides. The system shown in the embodiment of FIG. 6 is especially suitable for use in an automatic motor vehicle control and guidance system for maintaining a prescribed relative distance between vehicles following one another in a convoy, see, for example the above mentioned "Funkschau" Nr. 14/1988, page 42. An illuminating laser 1 again projects a laser beam 1' at the wave length λ1, which is, for example, between 800 and 950 nm or any other wave length suitable for the purpose, whereby the beam 1' is reflected by the scene and returns to the optical sensor 3 as the image beam 4' through the receiver optics 4. The control or gating or sampling beam 7' generated by the control or gating laser 7 illuminates the image sensor 3 in the form of a CCD-array on the side opposite to the side on which the image beam 4' is incident.

Figure 7:
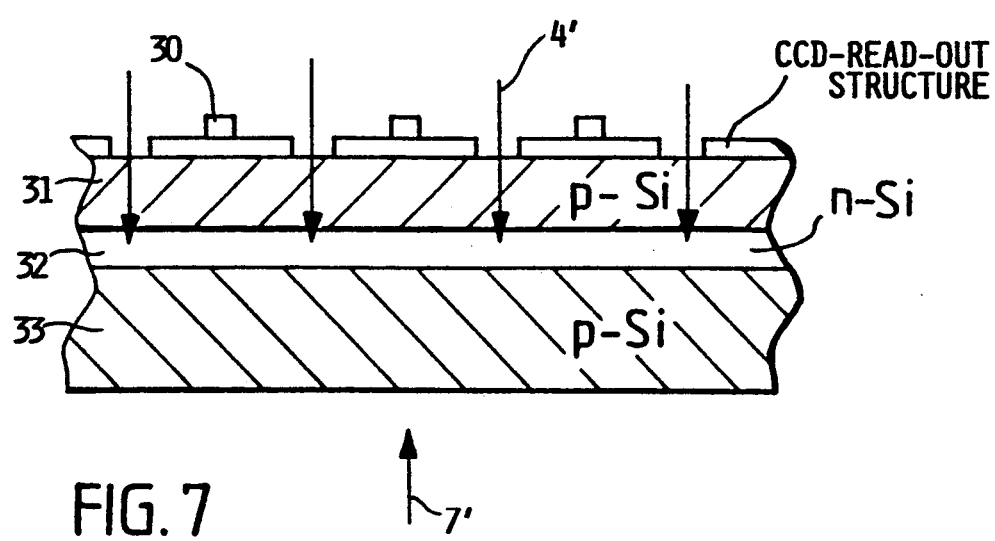
FIG. 7 is a cross-section through a variation of an optical sensor or receiver element similar to that of FIG. 5 which can be used in the arrangement of FIG. 6.

FIG. 7 is a cross-section through another sensor element or CCD-array 3 which can be used in the arrangement of FIG. 6, which is somewhat similar to the sensor of FIG. 5 in that the image beam 4' and the control beam 7' illuminate the sensor 3 from opposite sides. However, in the embodiment of FIG. 7, the incident image beam 4' illuminates the CCD-element from above on the side carrying the read-out electrodes 30. In FIG. 5 the control beam 7' enters on the side carrying the read-out electrodes 23. The CCD-sensor structure in FIG. 7 includes a p-Si layer 31, a middle n-Si layer 32, and a bottom p-Si layer 33. The control beam 7' typically having a wave length of 1400 nm illuminates the CCD-element from below as shown.

Figure 8:
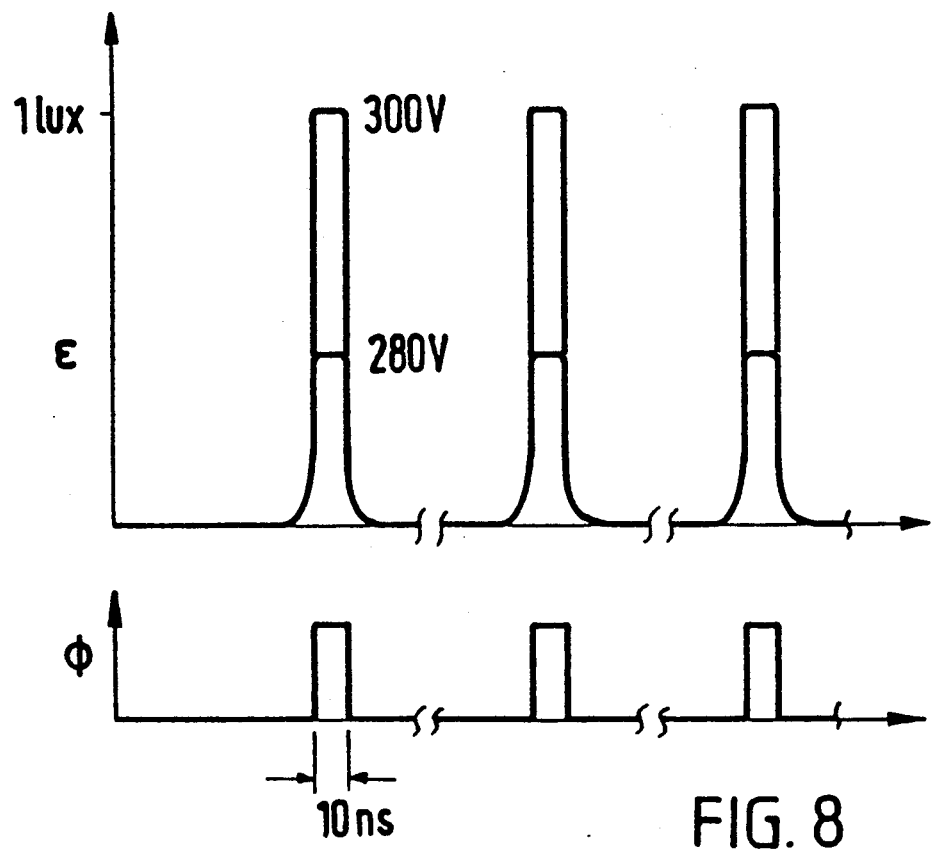
FIG. 8 is a pulse diagram showing signal sequences or pulse trains for controlling an optical sensor or receiver element of FIG. 7.

FIG. 8 is a diagram showing the signal or pulse sequences involved in the operation of the image sensor 3 according to the invention. The upper part of FIG. 8 shows the radiation ε having the wave length λ1 to be measured as a function of time on the abscissa with an illumination intensity up to approximately 10,000 lux for control voltage pulses of −300 V and for −280 V applied across the image sensor to carry out the optical control or gating of the image sensor as described above.

The lower part of the diagram of FIG. 8 shows the current slow Φ on the ordinate in the form of timed pulses at a sampling time of the control or gating or sampling laser pulses limited in duration to approximately 10 ns or shorter. Other sampling pulse forms or modulations are possible, e.g. pulse code modulation or pulse duration modulation may be applied to the sampling beam 7'.

Figure 9:
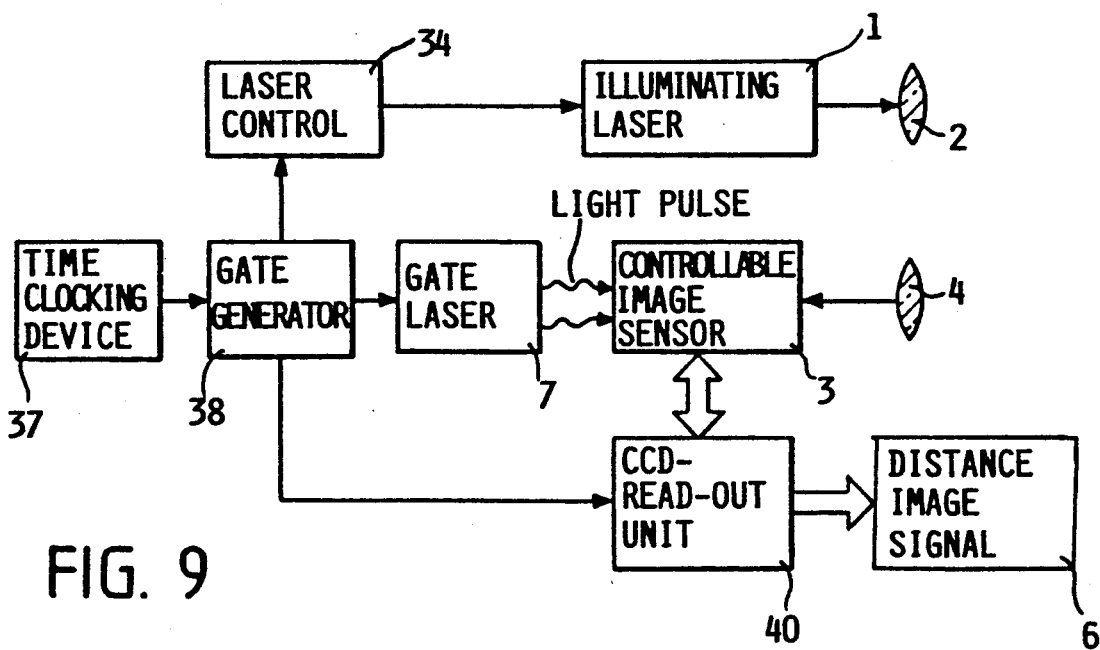
FIG. 9 is a block circuit diagram for operating an optically controllable image sensor according to the invention in a system for providing, to a driver of a vehicle, information regarding other vehicles or obstacles on the road ahead.

FIG. 9 shows a block circuit diagram of the entire system especially employed in a motor vehicle control and guidance system as described above. A laser control 34 activates an illuminating laser 1 which illuminates the subject image through a lens or transmitting optics 2. A reflected beam is received through receiving optics 4 and impinges on a controllable image sensor 3 according to the invention. A time clocking device 37 activates a gate generator 38 which simultaneously provides control impulses to the laser control 34 and to the gating or sampling laser 7 which transmits pulses to the controllable image sensor 3. The gate generator 38 further activates a CCD-read-out unit 40 which receives the image information from the controllable image sensor 3 to produce a distance image signal 6' for showing the scene 6.

The above description shows that a flat planar image sensor has been constructed having a high sensitivity and also a capability of controlling the sensor in very short time intervals in the ns range, especially less than 10 ns, for example 5 ns. This capability of the image sensor according to the invention enables the sensor to effectively operate as an electronic shutter for a CCD-camera or as a sensor in a motor vehicle guidance system as described above. According to the invention, the sensitivity has been increased or the signal has been amplified by a factor of approximately 100 due to the special utilization of the avalanche effect. The amplification factor may be adjusted by varying the avalanche voltage applied across the semiconductor element.

The sensor according to the invention may be advantageously used in a spacing warning system and distance measurement system using a laser according to, for example, German Patent Publication (DE) 3,640,449 C1. The sensor according to the invention may further be used in an automatic guidance system "Prometheus" as described, for example, in "Bild der Wissenschaft" 10/1988, page 134.

Although the invention has been described with reference to specific example embodiments, it will be appreciated, that it is intended to cover all modifications and equivalents within the scope of the appended claims.

What we claim is:

1. A controllable semiconductor image sensor, comprising a sensor semiconductor device, CCD-read-out means as part of said sensor semiconductor device for reading-out sensed image information, avalanche diode means arranged in said sensor semiconductor device for amplifying by an avalanche a photon current produced in response to exposure of said sensor semiconductor device to light from an image scene, means for generating a space charge in a space charge region of said sensor semiconductor device and for causing a charge carrier transport toward said CCD-read-out means to provide image information at said CCD-read-out means in response to said image scene light, and control light source means for directing control light impulses onto said space charge region for optically controlling said sensor semiconductor device.

2. The image sensor of claim 1, wherein said sensor semiconductor device is constructed as a CCD-semiconductor device.

3. The image sensor of claim 1, wherein said control light source means controls said sensor semiconductor device as an optical shutter.

4. The image sensor of claim 1, wherein said control light source means controls said sensor semiconductor device as an optical image information receiver.

5. The image sensor of claim 1, wherein said control light source comprises a laser light source means.

6. The image sensor of claim 1, wherein said sensor semiconductor device is a linear array.

7. The image sensor of claim 1, wherein said sensor semiconductor device is a two-dimensional array.

8. The device of claim 1, wherein said CCD-read-out means are arranged for a serial or parallel read-out.

9. A method of controlling the image signal sensitivity and the amplification in a semiconductor device including a sensor semiconductor combined with an avalanche diode, read-out means, and control light source means, comprising the following steps:
 (a) exposing said sensor semiconductor to light from an image scene to generate a space charge in a defined region of said sensor semiconductor,
 (b) illuminating said defined region of said sensor semiconductor in a controlled and adjustable manner with control light from said control light source means to affect said space charge,
 (c) causing a charge carrier transport current of said space charge to said read-out means,
 (d) amplifying said charge carrier transport current in said avalanche diode; and
 (e) reading an image signal from said read-out means.

10. The method of claim 9, wherein said illuminating with said control light source means is carried out in a pulsed manner to cause a pulsed or shuttered charge carrier transport current.

* * * * *